United States Patent
Dietrich et al.

(10) Patent No.: US 6,385,123 B1
(45) Date of Patent: May 7, 2002

(54) INTEGRATED CIRCUIT HAVING A DECODER UNIT AND AN ADDITIONAL INPUT OF A DECODER UNIT TO DETERMINE A NUMBER OF OUTPUTS TO BE ACTIVATED

(75) Inventors: Stefan Dietrich, Türkenfeld; Peter Schrögmeier, München; Sabine Schöniger, München; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/606,589

(22) Filed: Jun. 29, 2000

(30) Foreign Application Priority Data

Jun. 29, 1999 (DE) .......................... 199 29 725

(51) Int. Cl.$^7$ ................................. G11C 8/00
(52) U.S. Cl. ..................... 365/230.06; 365/230.02
(58) Field of Search ................ 365/230.06, 230.02

(56) References Cited

U.S. PATENT DOCUMENTS 4,819,212 A  *  4/1989  Nakai et al. ............... 365/230

4,907,070 A  *  3/1990  Wesolowski ................ 358/17

FOREIGN PATENT DOCUMENTS

| DE | 41 33 345 A1 | 4/1992 | |
| JP | 0051085 | * 5/1981 | ............ G11C/8/00 |
| JP | 0003163 | * 1/1990 | ........... G11C/11/41 |

OTHER PUBLICATIONS

Betty Prince, "Semiconductor Memories", 1984, Wisley, 2nd Edition, pp. 160–161.*

* cited by examiner

*Primary Examiner*—David Nelms
*Assistant Examiner*—M. Tran
(74) *Attorney, Agent, or Firm*—Herbert L. Lerner; Laurence A. Greenberg; Werner H. Stemer

(57) ABSTRACT

The integrated circuit has a first decoder unit and a second decoder unit D2 connected in parallel with the latter, which decode the input signals fed to them in a different way in each case. The inputs of the second decoder unit D2 are connected to a respective one of the inputs of the first decoder unit D1. n lines L1 to be selected are each connected to a respective one of the outputs of the two decoder units D1, D2. Via their outputs, the first decoder unit D1 and the second decoder unit D2 determine, in a first operating mode and in a second operating mode, respectively, the potentials of the lines L1 to be selected.

5 Claims, 1 Drawing Sheet

INTEGRATED CIRCUIT HAVING A DECODER UNIT AND AN ADDITIONAL INPUT OF A DECODER UNIT TO DETERMINE A NUMBER OF OUTPUTS TO BE ACTIVATED

BACKGROUND OF THE INVENTION

FIELD OF THE INVENTION

The invention lies in the integrated technology field and relates, more specifically, to an integrated circuit having a decoder unit.

Decoder units serve for decoding input signals, as a function of which they activate their outputs. Decoder units are used for example in the form of address decoders in integrated memories. Many of the memories have a column decoder for decoding column addresses and a row decoder for decoding row addresses. Memory cells that are to be selected are situated at crossover points between the rows and the columns. SGRAMs (Synchronous Graphic Random Access Memories) are a special type of integrated memories. They have a block writing operating mode, in which a plurality of columns are accessed simultaneously during a write access, whereas in a normal operating mode or during read accesses, in principle only one column is accessed simultaneously. For this purpose, the column decoder of an SGRAM has an additional input via which the number of outputs of the column decoder that are to be activated simultaneously can be controlled.

Due to the provision of the further input signal fed in via the additional input in the case of the column decoder of the SGRAM, the latter has to be provided with additional logic gates in the column decoder compared with memories which do not have a block writing operating mode. As a result, the implementation of the column decoder becomes more complicated and the input signals fed in via its inputs have to be passed via a greater number of logic gates. This means that a column decoder of this type operates more slowly than column decoders which do not enable a block writing operating mode. For this reason, the addressing of the columns in SGRAMs of this type during write accesses and read accesses, both in the block writing operating mode and in the normal operating mode, takes place more slowly than in memories which do not have a block writing operating mode.

SUMMARY OF THE INVENTION

The object of the invention is to provide an integrated circuit having a decoder unit which overcomes the above-noted deficiencies and disadvantages of the prior art devices and methods of this kind, and in which in each case different decoding is effected in different operating modes, where the decoding speed can be optimized for each operating mode.

With the above and other objects in view there is provided, in accordance with the invention, an integrated circuit, comprising:

a first decoder unit having a number 1 inputs for receiving input signals to be decoded and a number n outputs to be activated in dependence on the input signals;

a second decoder unit connected in parallel with the first decoder unit, the second decoder unit having 1 inputs for receiving the input signals to be decoded differently from the first decoder unit and n outputs to be activated in dependence on the input signals;

the inputs of the second decoder unit being connected to a respective one of the inputs of the first decoder unit;

n lines to be selected and each connected to a respective one of the outputs of the first and second decoder units;

in a first operating mode, the first decoder unit determining, via the outputs thereof, a potential of the lines to be selected, and, in a second operating mode, the second decoder unit determining, via the outputs thereof, the potentials of the lines to be selected.

In other words, the integrated circuit has a first decoder unit and a second decoder unit connected in parallel with the latter. The decoder units decode the input signals fed to them in a different way in each case. The inputs of the second decoder unit are connected to a respective one of the inputs of the first decoder unit. The integrated circuit has lines to be selected, which are each connected to a respective one of the outputs of the two decoder units. Via their outputs, the first decoder unit and the second decoder unit determine, in a first operating mode and in a second operating mode, respectively, the potentials of the lines to be selected.

In the two operating modes, the two decoder units enable in each case different activation of the lines to be selected, as a function of the input signals. In contrast to circuits in which there is merely a decoder unit which performs in each case different decodings in two operating modes, the two decoder units of the integrated circuit according to the invention can be optimized with regard to the respective decoding that they are to perform.

In accordance with an added feature of the invention, the integrated circuit is a memory with a plurality of memory cells arranged at crossover points of word lines and bit lines. The input signals thereby are address signals for selectively addressing the word lines and the bit lines.

By way of example, the integrated circuit may be an integrated memory of the SGPAM type, in which the two decoder units each serve for decoding a column address formed by the input signals. The first operating mode may then be a block writing operating mode, for example, in which the first decoder unit, for each column address fed to it, activates in each case a plurality of the lines to be selected, and the second operating mode may be a normal operating mode in which, during write and read accesses, the second decoder unit, for each column address fed to it, activates only in each case one of the lines to be selected.

In accordance with an additional feature of the invention, the first operating mode defines a write access to the memory cells and the second operating mode defines a read access to the memory cells.

In accordance with another feature of the invention, the first decoder unit has at least one additional input for feeding in a further input signal for additionally influencing an activation of the outputs of the first decoder unit.

In accordance with a further feature of the invention, the further input signal received via the additional input of the first decoder unit determines a number of the outputs to be activated in each case simultaneously by the first decoder unit.

In accordance with again an added feature of the invention, a multiplexer is connected between the outputs of the first and second decoder units and the lines to be selected, the multiplexer conductively connecting the outputs of the first decoder unit to the lines to be selected in the first operating mode, and conductively connecting the outputs of the second decoder unit to the lines to be selected in the second operating mode.

As an alternative to this, the outputs of the two decoder units may also be connected directly to the lines to be selected, in each case the outputs of one of the two decoding units being activated in each operating mode, with the result that the associated decoder unit does not influence the potentials on the lines to be selected.

In accordance with a concomitant feature of the invention, the first and second decoder units are alternatively operable decoder stages of a multistage decoder circuit, and the decoder circuit having at least one further decoder stage with n inputs each connected to a respective one of the lines to be selected.

This development has the advantage that the two decoder units merely form a subcircuit of the decoder circuit, with the result that a portion of the decoding of the input signals is effected via the further decoder stage in both operating modes. Since the further decoder stage is utilized in both operating modes, the decoder circuit can be produced with a relatively small area.

Other features which are considered as characteristic for the invention are set forth in the appended claims.

Although the invention is illustrated and described herein as embodied in an integrated circuit having a decoder unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
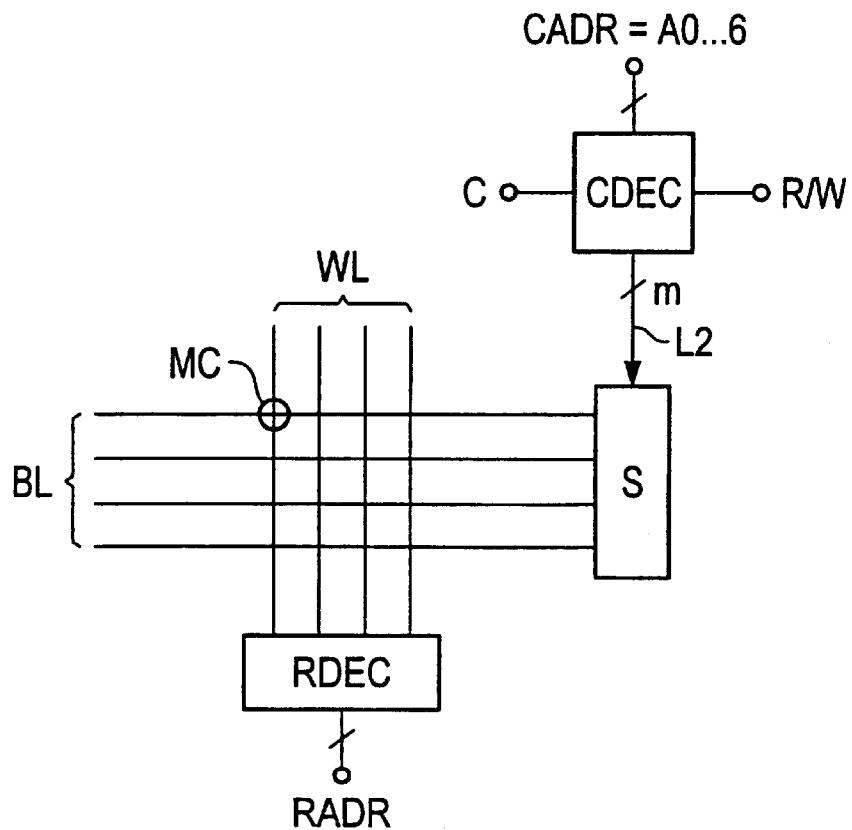
FIG. 1 is a diagrammatic view of an integrated circuit in the form of an integrated memory.

Referring now to the figures of the drawing in detail and first, particularly, to FIG. 1 thereof, there is seen a detail of an integrated memory of the SGRAM type. Memory cells MC are arranged at crossover points of word lines WL and bit lines BL. The word lines WL can be addressed via a row decoder RDEC as a function of a row address RADR received at an input of the row decoder. The bit lines BL can be addressed via a column decoder CDEC as a function of a column address CADR fed to the column decoder. The column address has a width of 7 bits. The outputs of the row decoder RDEC are connected to a respective one of the word lines WL. The bit lines BL are connected to a data line I/O via a circuit unit S. The output signals of the column decoder CDEC are fed to a circuit unit S via lines L2. As a function of the output signals of the column decoder CDEC, the circuit unit S connects, in multiplex, one of the bit lines BL to the data line I/O. Furthermore, an operating mode signal C and a control signal R/W are fed to the column decoder CDEC. The operating mode signal C determines whether a write access or a read access is made to the memory.

Figure 2:
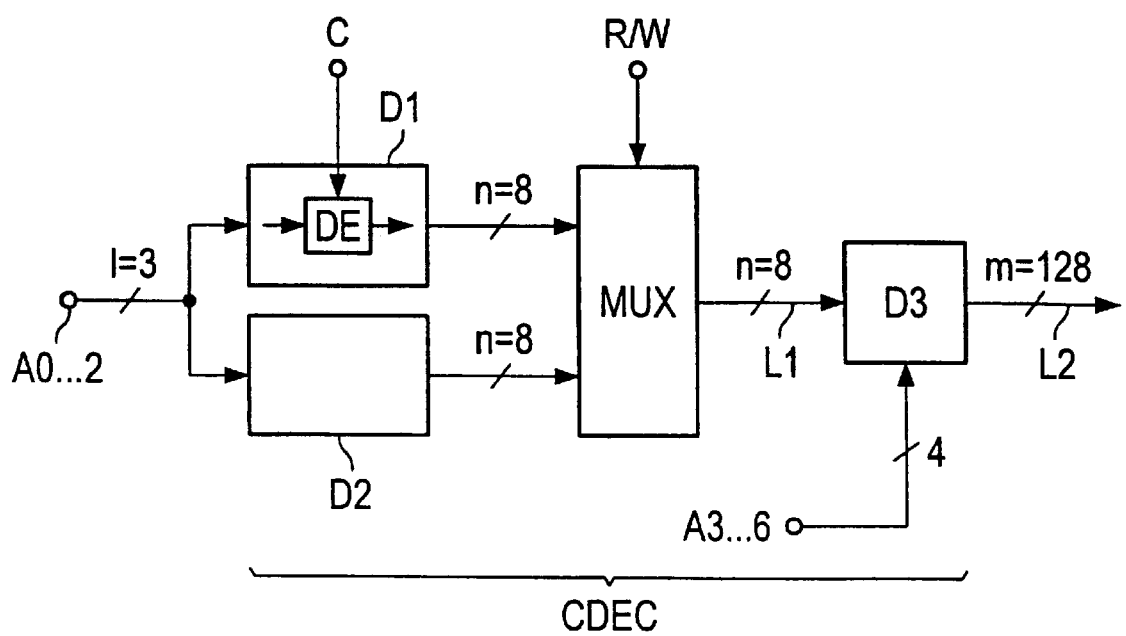
FIG. 2 is a block diagram of a column decoder of the integrated circuit of FIG. 1.

With reference to FIG. 2, there is shown the structure of the column decoder CDEC of FIG. 1. The decoder has a first decoder unit D1 and a second decoder unit D2 connected in parallel with the latter. The two decoder units D1, D2 have l=3 inputs, to which 3 bits A0 . . . 2 of the column address CADR are fed. The two decoder units D1, D2 have n=8 outputs, which are connected to corresponding inputs of a multiplexer MUX. The n outputs of the multiplexer MUX are connected via n lines L1 to a respective input of a third decoder unit D3. The outputs of the third decoder unit D3 are the outputs of the column decoder CDEC and, therefore, are connected via the m=128 lines L2 to the circuit unit S of FIG. 1. The four remaining address bits A3 . . . 6 of the column address CADR are additionally fed to the third decoder unit D3.

A control input of the multiplexer MUX is connected to the control signal R/W. The first decoder unit D1 has an additional input, via which an operating mode signal C is fed to the decoder unit D1. If the control signal R/W indicates that a write access is intended to be made to the memory, the multiplexer MUX connects the outputs of the first decoder unit D1 to the inputs of the third decoder unit D3. If, on the other hand, the operating mode signal C indicates that a read access is intended to be made, the multiplexer MUX connects the outputs of the second decoder unit D2 to the inputs of the third decoder unit D3. The lines L1 via which the outputs of the multiplexer MUX are connected to the third decoder unit D3 are designated as "lines to be selected" below, since they are selected or activated via the outputs either of the first decoder unit D1 or of the second decoder unit D2.

The first decoder unit D1 and the second decoder unit D2 each perform different decoding of the input signals A0 . . . 2 that are fed to them. Specifically, in the case of the first decoder unit D1 said decoding is effected as a function of the operating mode signal C fed to it. In principle, the second decoder unit D2 only ever activates one of its outputs simultaneously. At a first level of the operating mode signal C, the decoding by the first decoder unit D1 does not differ from that by the second decoder unit D2. This is the case for those write accesses in which the SGRAM is in a normal operating mode. As a function of the input signals A0 . . . 2 fed to it, the first decoder unit D1 then activates only in each case one of its outputs simultaneously. At a second level of the operating mode signal C, the first decoder unit D1 activates all eight outputs simultaneously. As a result, all eight lines L1 to be selected are activated simultaneously, provided that the multiplexer MUX connects the outputs of the first decoder unit D1 to the third decoder unit D3.

The third decoder unit D3 has m=128 outputs, which are connected to the lines L2. It selects the lines L2 at its outputs as a function of the potentials on the lines L1 to be selected and of the four address bits A3 . . . 6. If only one of the lines L1 to be selected is activated, the third decoder unit D3 also activates only one of the lines L2. If, on the other hand, all of the lines L1 to be selected are activated simultaneously, the third decoder unit D3 selects in each case 8 of the 128 lines L2 as a function of the address bits A3 . . . 6. The latter situation occurs, as explained above, for a write access in which the second level of the operating mode signal C is fed to the first decoder unit D1. In that situation, 8 of the bit lines BL are then connected simultaneously to the data line I/O via the circuit unit S in FIG. 1, with the result that the same datum can be transferred simultaneously from the data line I/O to the eight bit lines BL and be stored in eight memory cells MC. At the first level of the operating mode signal C or in the event of read accesses in which only one of the lines L1 to be selected and one of the lines L2 are activated simultaneously, only precisely one of the bit lines BL is ever connected to the data line I/O via the circuit unit S.

The diagram of FIG. 2 indicates that the first decoder unit D1 has additional decoder elements DE compared with the second decoder unit D2. These decoder elements enable the output signals of the first decoder unit D1 to be influenced by means of the control signal C. These additional decoder elements have the consequence that changes in the input signals A0 . . . 2 at both levels of the operating mode signal C, appear later at the outputs of the first decoder unit D1 than is the case with the second decoder unit D2. Therefore, in this exemplary embodiment, the decoding of the column addresses CADR by the column decoder CDEC is effected more rapidly during read accesses, in which the second decoder unit D2 is active, than during write accesses, in which the first decoder unit D1 is active. The invention therefore enables faster read accesses to the memory than if, instead of the first decoder unit D1 and the second decoder unit D2, merely a common decoder unit were provided, as is usually the case.

In this exemplary embodiment, the two decoder units D1, D2 supply predecoded addresses at their outputs, which addresses are decoded further by the third decoder unit D3 as a function of the address bits A3 . . . 6.

In other exemplary embodiments of the invention, the third decoder unit D3 may also be omitted, so that the first decoder unit D1 and the second decoder unit D2 are connected directly to the m lines L2 via the multiplexer MUX. The two decoder units D1, D2 then serve for decoding all 7 bits A0 . . . 6 of the column address CADR and, therefore, each have 7 inputs and 128 outputs.

We claim:

1. An integrated circuit, comprising:
   a first decoder unit having a number 1 inputs for receiving input signals to be decoded and a number n outputs to be activated in dependence on the input signals;
   a second decoder unit connected in parallel with said first decoder unit, said second decoder unit having 1 inputs for receiving the input signals to be decoded differently from said first decoder unit and n outputs to be activated in dependence on the input signals;
   said inputs of said second decoder unit being connected to a respective one of said inputs of said first decoder unit;
   n lines to be selected and each connected to a respective one of said outputs of said first and second decoder units;
   in a first operating mode, said first decoder unit determining, via said outputs thereof, a potential of said lines to be selected, and, in a second operating mode, said second decoder unit determining, via said outputs thereof, the potentials of said lines to be selected; and
   said first decoder unit having at least one additional input for feeding in a further input signal for additionally influencing an activation of said outputs of said first decoder unit, and the further input signal received via said additional input of said first decoder unit determining a number of said outputs to be activated in each case simultaneously by said first decoder unit.

2. The integrated circuit according to claim 1, which comprises an integrated memory with a plurality of memory cells arranged at crossover points of word lines and bit lines, and wherein the input signals are address signals for selectively addressing said word lines and said bit lines.

3. The integrated circuit according to claim 2, wherein said first operating mode defines a write access to said memory cells and said second operating mode defines a read access to said memory cells.

4. The integrated circuit according to claim 1, which further comprises a multiplexer connected between said outputs of said first and second decoder units and said lines to be selected, said multiplexer conductively connecting said outputs of said first decoder unit to said lines to be selected in the first operating mode, and conductively connecting said outputs of said second decoder unit to said lines to be selected in said second operating mode.

5. The integrated circuit according to claim 1, wherein said first and second decoder units are alternatively operable decoder stages of a multistage decoder circuit, and said decoder circuit having at least one further decoder stage with n inputs each connected to a respective one of said lines to be selected.

* * * * *